US009874597B2

(12) United States Patent
McCord et al.

(10) Patent No.: US 9,874,597 B2
(45) Date of Patent: Jan. 23, 2018

(54) LIGHT-EMITTING DEVICE TEST SYSTEMS

(71) Applicant: KLA-TENCOR CORPORATION, Milpitas, CA (US)

(72) Inventors: Mark McCord, Los Gatos, CA (US); Alan Brodie, Palo Alto, CA (US); James George, Berkeley, CA (US); Yu Guan, Pleasanton, CA (US); Ralph Nyffenegger, Palo Alto, CA (US)

(73) Assignee: KLA-Tenor Corporation, Milpitas, CA (US)

( * ) Notice: Subject to any disclaimer, the term of this patent is extended or adjusted under 35 U.S.C. 154(b) by 269 days.

(21) Appl. No.: 14/696,891

(22) Filed: Apr. 27, 2015

(65) Prior Publication Data

US 2015/0316604 A1 Nov. 5, 2015

Related U.S. Application Data

(60) Provisional application No. 61/986,639, filed on Apr. 30, 2014.

(51) Int. Cl.
*G01R 31/26* (2014.01)

(52) U.S. Cl.
CPC ..... *G01R 31/2635* (2013.01); *G01R 31/2601* (2013.01)

(58) Field of Classification Search
USPC ......... 324/762.07, 762.01, 537, 500, 750.16, 324/750.19; 356/326, 218, 236, 237.4, 356/300, 319, 338
See application file for complete search history.

(56) References Cited

U.S. PATENT DOCUMENTS

| 5,537,203 A * | 7/1996 | Carr ........................ G01J 1/04 250/228 |
| 6,597,195 B1 * | 7/2003 | Beaudry .................. G01J 1/08 324/750.05 |
| 7,804,589 B2 | 9/2010 | Tseng et al. |
| 2009/0309606 A1 * | 12/2009 | Tseng ....................... G01J 1/02 324/501 |

(Continued)

FOREIGN PATENT DOCUMENTS

| CN | 102004029 B | 8/2012 |
| JP | 2013003061 A | 1/2013 |

(Continued)

OTHER PUBLICATIONS

CN 202316339 (U), Weiguang et al., Fully-automatic LED (Light Emitting Diode) light-splitting and sorting system, Jul. 11, 2012,Yiwu Phlight Electronic Co Ltd.*

(Continued)

*Primary Examiner* — Melissa Koval
*Assistant Examiner* — Nasima Monsur
(74) *Attorney, Agent, or Firm* — Hodgson Russ LLP

(57) ABSTRACT

Light-emitting devices, such as LEDs, are tested using a photometric unit. The photometric unit, which may be an integrating sphere, can measure flux, color, or other properties of the devices. The photometric unit may have a single port or both an inlet and outlet. Light loss through the port, inlet, or outlet can be reduced or calibrated for. These testing systems can provide increased reliability, improved throughput, and/or improved measurement accuracy.

8 Claims, 16 Drawing Sheets

(56) References Cited

U.S. PATENT DOCUMENTS

| | | | |
|---|---|---|---|
| 2010/0256802 A1 | 10/2010 | Garcia et al. | |
| 2010/0301777 A1* | 12/2010 | Kraemer | H05B 33/0803 |
| | | | 315/312 |
| 2012/0319712 A1 | 12/2012 | Garcia | |
| 2012/0326060 A1 | 12/2012 | Kenane et al. | |
| 2013/0119275 A1 | 5/2013 | Solarz | |
| 2013/0201321 A1 | 8/2013 | Chao et al. | |
| 2014/0091820 A1* | 4/2014 | Emery | G01R 1/06794 |
| | | | 324/754.1 |

FOREIGN PATENT DOCUMENTS

| | | |
|---|---|---|
| KR | 10-2010-0099945 A | 9/2010 |
| KR | 10-1042936 B1 | 6/2011 |

OTHER PUBLICATIONS

JP 2000310593(A), Iwami et al., Photometric apparatus and light changeover device therefor, Nov. 7, 2000, Kubota KK.*
McCord et al., "High-Throughput, High-Precision Hot Testing Tool for HBLED Testing," 2013, pp. 1-14, available at http://apps1.eere.energy.gov/buildings/publications/pdfs/ssl/mccord-mfgrd_boston2013.pdf.
Gigahertz-Optik, "BTS256-LED Tester," Jun. 2009, pp. 1-22.

* cited by examiner

LIGHT-EMITTING DEVICE TEST SYSTEMS

CROSS-REFERENCE TO RELATED APPLICATIONS

This application claims priority to the provisional patent application assigned U.S. App. No. 61/986,639 filed Apr. 30, 2014, the disclosure of which is hereby incorporated by reference in its entirety.

STATEMENT REGARDING FEDERALLY-SPONSORED RESEARCH OR DEVELOPMENT

This invention was made with government support under DE-EE0005877 awarded by the U.S. Department of Energy. The government has certain rights in the invention.

FIELD OF THE DISCLOSURE

This disclosure relates to photometric units for light-emitting devices.

BACKGROUND OF THE DISCLOSURE

A photometric unit, such as an integrating sphere, is used to determine the total luminous flux or color of a light-emitting device. Luminous flux is the measure of the perceived power of light and can be used as an objective measure of the useful light emitted by a light source. The luminous flux of a light-emitting device can provide an estimate of an apparent amount of light that the light-emitting device will produce.

During testing, a light-emitting device, such as a light-emitting diode (LED), is energized. In the photometric unit, the emitted light from the light-emitting device reflects or diffuses. Diffused light is transported to an optical spectrum analyzer, such as via an optical fiber. After a comparison with data from a test using a reference light under the same testing conditions, the luminous flux of the light-emitting device is obtained.

For example, LEDs can be measured and sorted for color or total luminous flux using integrating sphere-based photometric equipment. The LED is usually placed at a certain distance from a port of the integrating sphere rather than being inserted into the integrating sphere. This results in a significant amount of light loss because some light from the LED does not enter the port and light already inside the integrating sphere escapes through the port. Light collection cones or masks with specular or diffusive reflection surfaces can be used to prevent such light loss, but these devices either still do not allow for complete collection of the LED's light or can significantly alter optical properties of the integrating sphere, both of which result in measurement errors. Furthermore, such errors are difficult to correct through calibrations because the proportion of the lost light varies with an individual LED. The light beam profile or the positioning of the individual LED with respect to the port may not be consistent between LEDs. These variables make it difficult to predict light loss or correct for light loss, such as with a scaling factor. Consequently, these errors contribute to larger tolerances in product specifications, such as with respect to color, lumens, and/or yield loss. Large tolerances in color and lumen specifications can cause LEDs to be ill-suited for particular applications and large tolerances for color or lumen specifications can be undesirable to LED manufacturers.

Figures of merit for such photometric units include accuracy of optical and electrical measurement, throughput, and reliability of mechanical handling. There are tradeoffs among these figures of merit. On some equipment, the LED is kept at a certain distance from a port of the integrating sphere for measurement in favor of higher throughput. Part of the LED's light is then either lost or collected with a device other than the integrating sphere (which may have different optical properties), resulting in various degrees of optical measurement errors. On other equipment, the LED is measured inside the integrating sphere for complete light collection. Throughput is then lowered because the LED has to be longitudinally moved a certain distance (typically from a few mm to a few cm) in order to be put into and taken out of the integrating sphere for each measurement. Reliable electrical contact (required for accurate electrical and optical measurement) and mechanical handling of the LEDs are also challenging at high throughput. Such measurements can involve single LEDs which are only held from the edges (typically only about 0.5 mm wide) by clamps to avoid blocking any light from the LED. The LED is then contacted at its two lead pads (anode and cathode) on its backside by four pogo pin probes which send drive current through the LED to "light it up" for optical testing and measure its forward voltage at the same time. In production testing with adequate throughput, the four probes simultaneously impact the LED with significant mass and speed when they engage, making it difficult for the clampers to reliably hold the LED every time. To secure the LED, an aperture slightly smaller than the top surface of the LED or a window is placed in close proximity above the LED on some equipment, but this results in optical measurement errors because some amount of light from the LED is blocked or reflected. The amount of light that is blocked or reflected varies with individual LEDs.

Two typical tradeoffs are throughput versus complete light collection and throughput versus reliable electrical contacting and mechanical handling. Reduction in LED travel distance typically reduces the amount of light that can be collected. Increases in throughput that involve more contact speed and force from the probes typically reduce reliability. Decreased reliability can result in measurement errors, false rejections, and equipment down time.

LEDs continue to shrink in size as the industry adopts chip scale packaging (CSP). This renders the tradeoff of throughput versus reliability more significant. Smaller LEDs are more difficult to handle reliably and likely limit contact speed of a probe. Smaller LEDs also may require thinner probes, which may be less reliable, and tighter positioning tolerance.

Current photometric units or other test systems suffer from low throughput and are not adequate for manufacturing settings. One current photometric unit has a device flow that is start-stop-start. In an example, an LED is placed proximate an integrating sphere, held motionless for a period while measurements to test color or lumen output are made, and then moved out of the integrating sphere. While the actual test in the integrating sphere may be as short as a millisecond, such a stepped motion may limit overall throughput in the test system to a few LEDs per second.

Therefore, what is needed is an improved test system and, more particularly, a high-throughput photometric unit.

BRIEF SUMMARY OF THE DISCLOSURE

In a first embodiment, a test system is provided. The test system includes a photometric unit, a conveyor, a spectrometer, and an electrical connector. The photometric unit has a body around a cavity. The body defines an inlet and an outlet. The conveyor extends through the photometric unit and is disposed in the inlet and the outlet. The conveyor is configured to move continuously at one or more speeds greater than zero to convey devices through the photometric unit. The spectrometer is connected to the photometric unit and is configured to measure a flux of one of the devices on the conveyor in the cavity of the photometric unit. The electrical connector is configured to power one of the devices disposed on the conveyor in the cavity of the photometric unit while the conveyor is in motion. The devices may be LEDs and the photometric unit may be an integrating sphere.

A second conveyor may extend through the photometric unit and be disposed in the inlet and the outlet.

A controller may be in electrical communication with the spectrometer. The controller is configured to receive the measured flux from the spectrometer and calibrate for a reduction in measured flux due to the outlet, the inlet, and the conveyor.

The conveyor may include a spring-loaded edge grip configured to hold the LEDs on the conveyor.

A first pick and place robot may be upstream of the photometric unit and a second pick and place robot may be downstream of the photometric unit. The first pick and place robot is configured to place the devices on the conveyor. The second pick and place robot is configured to remove the devices from the conveyor.

The electrical connector may be a probe card configured to make a four-point contact with one of the devices on the conveyor. The probe card may include an anode current roller pad, an anode voltage roller pad, a cathode current roller pad, and a cathode voltage roller pad. The anode current roller pad and the anode voltage roller pad may connect to an anode contact on one of the devices on the conveyor and the cathode current roller pad and the cathode voltage roller pad may connect to a cathode contact on one of the devices on the conveyor.

The conveyor may be configured to move at a constant speed.

The test system may include a heating device configured to heat the devices on the conveyor.

In a second embodiment, a method is provided. Devices are continuously conveyed on a conveyor through an inlet and an outlet of a photometric unit while at one or more speeds greater than zero. Power is provided to each of the devices on the conveyor in the photometric unit while at the one or more speeds greater than zero. A flux of each of the devices is measured in the photometric unit. The photometric unit may be an integrating sphere and the devices may be LEDs.

In a third embodiment, a test system is provided. The test system includes an integrating sphere, a probe card, and a pair of clamps. The integrating sphere has a body around a cavity. The body defines a port. The probe card is configured to hold a device. The probe card includes two probes for delivering current to the device and two probes for measuring voltage across the device. The pair of clamps are configured to move toward and away from the device thereby clamping the device between them. A surface of each of the clamps is partially curved to have a substantially same radius of curvature as the integrating sphere. The clamps are configured to be disposed against the port of the integrating sphere. The surface of each of clamps continues a curvature of the integrating sphere when disposed against the port. The device may be an LED.

A coating on the surface of each of the clamps and a coating on an inner surface of the integrating sphere facing the cavity may be the same.

The clamps may be configured to position the device such that light from the device in a $2\pi$ solid angle is measured in the integrating sphere.

A top surface of each of the clamps may be planar and a port surface around the port of the integrating sphere may be planar. Each of the top surfaces is configured to fit proximate the port surface.

The probes of the probe card may include pogo pins.

The clamps and probe card may be configured to move between a loading position and a testing position. The clamps and probe card may be configured to only move horizontally relative to the integrating sphere.

In a fourth embodiment, a method is provided. A device is placed between a pair of clamps in a loading position. A surface of each of the clamps is partially curved to have a substantially same radius of curvature as the integrating sphere. The device is connected with a probe card. The probe card includes two probes for delivering current to the device and two probes for measuring voltage across the device. Each clamp is translated toward the device thereby securing the device between the clamps. The device is translated to a testing position relative to an integrating sphere. A flux of the device is measured with the integrating sphere in the testing position. The device may be an LED.

The probes may be connected to one or more external probes in the testing position.

The device may only translate horizontally between the loading position and the testing position.

The clamps and the device may be disposed against a port of the integrating sphere. The surface of each of clamps may continue a curvature of the integrating sphere when disposed against the port.

In a fifth embodiment, a test system is provided. The test system includes an integrating sphere, a device handling system, and a test mask. The integrating sphere has a body around a cavity. The body defines a port. The device handling system is configured to hold a device and includes a probe card. The test mask is configured to be disposed in the port of the integrating sphere. The test mask has a mask body that defines a mask aperture. The device is configured to be disposed in the mask aperture. A surface of the test mask is at least partially curved to have a substantially same radius of curvature as the integrating sphere. The surface of the test mask continues a curvature of the integrating sphere when disposed in the port. The device may be an LED.

The device and the test mask may define a gap between them.

The probe card may include two probes for delivering current to the device and two probes for measuring voltage across the device.

A coating on the surface of the test mask and a coating on an inner surface of the integrating sphere facing the cavity may be the same.

The device handling system may be configured to position the device in the test mask such that light from the device in a $2\pi$ solid angle is measured in the integrating sphere.

The device handling system may include a pair of clamps configured to move toward and away from the device thereby clamping the device between them. A coating on a surface of each of the clamps and a coating on a surface facing the cavity may be the same.

In a sixth embodiment, a method is provided. A device is placed between a pair of clamps of a device handling system in a loading position. The device is connected with a probe card. The probe card includes two probes for delivering current to the device and two probes for measuring voltage across the device. Each clamp is translated toward the device thereby securing the device between the clamps. The device is translated to a testing position relative to a mask aperture of a test mask disposed on an integrating sphere such that the device is disposed in the mask aperture. A surface of the test mask is at least partially curved to have a substantially same radius of curvature as the integrating sphere. The surface of the test mask continues a curvature of the integrating sphere when disposed in a port of the integrating sphere. A flux of the device is measured with the integrating sphere in the testing position. The device may be an LED.

The device and the test mask may define a gap between them when the device is disposed in the mask aperture.

Translating the device to the testing position may include translating the device vertically relative to the integrating sphere whereby the device is disposed in the mask aperture.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure.

Embodiments of testing systems for devices, such as LEDs, that are disclosed herein have greater throughput and/or measurement accuracy. Use of these testing systems can result in higher uptimes and improved binning of devices.

In an embodiment, a high-throughput test system for light-emitting devices, such as LEDs, can have a continuous material flow. Devices on a conveyor pass through an inlet of a photometric unit, are tested, and then pass through an outlet of the photometric unit. Power is supplied to the devices on the conveyor while the conveyor is conveying the devices. In one instance, power can be supplied while the conveyor is conveying the devices at one or more speeds greater than zero.

The devices can be powered using a probe card while the conveyor is in motion. For example, the conveyor may move at one or more speeds greater than zero while conveying devices through the photometric unit. The probe card can connect with the anode contact and cathode contact on one of the devices.

In an example, the photometric unit is an integrating sphere. The conveyor passes through an inlet and outlet of the integrating sphere. A controller that is in electrical communication with a spectrometer is configured to calculate a flux of one of the devices. This controller can calibrate for light loss through the outlet, through the inlet, and due to the presence of the conveyor in the integrating sphere.

Figure 1:
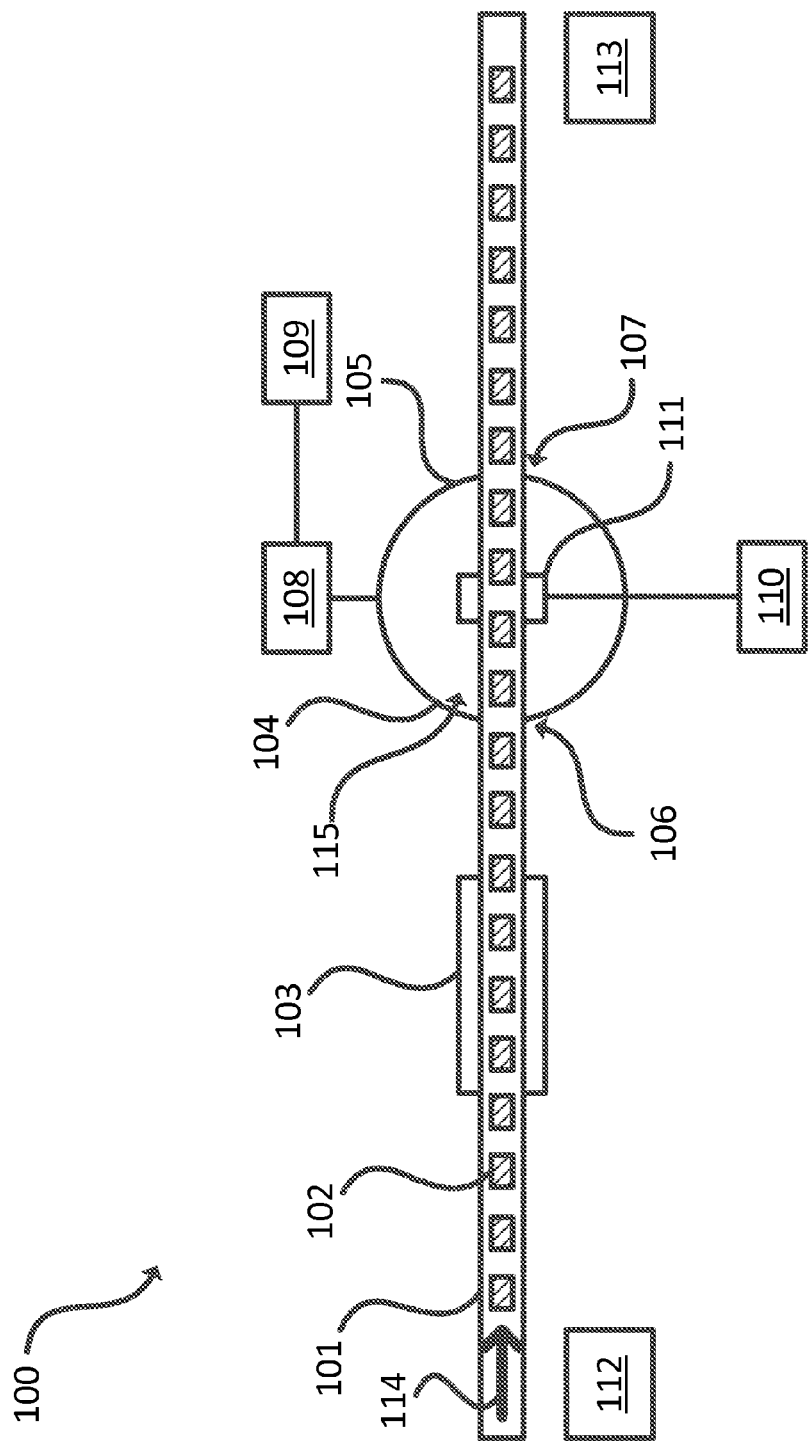
FIG. 1 is a block diagram of a first embodiment of a test system in accordance with the present disclosure.

FIG. 1 is a block diagram of a first embodiment of a test system 100. Devices 102 are disposed on a conveyor 101, which moves in the motion of the arrow 114. The devices 102 may be LEDs. In one example, the devices 102 are white light LEDs. LEDs can have a wide range of shapes, colors, and sizes with different light output intensities. For example, the LEDs may be approximately 0.2 mm to 4 mm in length or width, though other sizes are possible.

The conveyor 101 can move continuously. This may be at a constant speed or at a variable speed. If a variable speed is used, the conveyor 101 can have two or more speeds.

The conveyor 101 passes through a heating device 103. This heating device 103 may be a thermalization oven or another device. The heating device 103, which may use convective, resistive, or other types of heating, brings the devices 102 to a desired temperature prior to testing.

In one instance, a heated gas is provided to the heating device 103 by a circulation system (not illustrated). For example, a flow of 85° C. air may be provided to an interior of the heating device 103. One or more devices 102 thermally stabilize in the heating device 103 prior to entering the photometric unit 104. For example, a dozen devices 102 can stabilize in the thermalization oven 103. The output of the devices 102 may be temperature-dependent, so use of the heating device 103 can reduce measurement errors.

In another example, the conveyor 101 includes a passive or active heating system to thermally stabilize the devices 102. This can be used in conjunction with or instead of the heating device 103. For example, resistive heaters can be positioned on a surface of the conveyor 101 or heating lamps can be positioned above a surface of the conveyor 101.

The conveyor 101 passes through the photometric unit 104. The body 105 of the photometric unit 104 defines an inlet 106 and outlet 107. The inlet 106 and outlet 107 have dimensions large enough to enable the conveyor 101 to project or extend through the inlet 106 and outlet 107. The dimensions of the inlet 106 and outlet 107 may be minimized to reduce loss of light or entry of unwanted light during testing in the photometric unit 104. Doors or light blocking mechanisms also can be used with the inlet 106 or outlet 107 to reduce loss of light or entry of unwanted light.

The photometric unit 104 may be an integrating sphere. Such an integrating sphere has a hollow, spherical interior that is covered by a coating and is configured to spatially integrate radiant flux. The coating may be a white reflective coating, for example. One or more baffles may be present on the sides of the spherical interior.

Light rays incident on any point on the inner surface of the integrating sphere are distributed equally to all other points by one or more scattering reflections. Thus, scattered light is evenly distributed over all angles. Since nearly all the light is collected, a detector connected to an integrating sphere can accurately measure the sum of all ambient light inside the integrating sphere. The flux of a device can be measured with minimized inaccuracy caused by the directional characteristics of the light source. Light beam shape, incident direction, and incident position have a minimized effect on flux measurements using the integrating sphere.

The photometric unit 104 may have other designs than the integrating sphere described above. For example, the photometric unit 104 may be a cube or may have other shapes.

Optical tests in the photometric unit 104 are performed in a cavity 115 of the photometric unit 104 defined by the body 105 while the devices 102 are in motion. During testing, the conveyance of the devices 102 using the conveyor 101 may be at a constant speed, slowed, or sped up.

A heated gas may be provided to the photometric unit 104. For example, a flow of 85° C. air may be provided to an interior of the photometric unit 104. In an instance, this comes from the same source as that which provides heated air to the heating device 103.

A spectrometer 108 is connected to the photometric unit 104. The spectrometer 108 can measure intensity of light as a function of wavelength or frequency. The spectrometer 108 can be configured to measure a flux of one of the devices 102 on the conveyor 101 in the cavity of the photometric unit 104. An optical fiber or light tube can connect the spectrometer 108 and photometric unit 104, though other optical connections are possible.

A controller 109 is in electrical communication with the spectrometer 108. The controller 109 is configured to calculate a flux of each of the devices 102. This controller 109 is configured to calibrate for light loss through the outlet 107, through the inlet 106, and due to the presence of the conveyor 101, which may absorb light from the device 102 being tested. For example, the controller 109 can calibrate to account for light absorbed by the conveyor 101 that is not measured by the spectrometer 108. The controller 109 also can calibrate to account for entry of unwanted light or other light loss.

Each device 102 can be associated with a flux value by the controller 109 or a different controller operatively connected to the test system 100. For example, a database or other storage method can record the flux associated with a particular device 102. This information can be used for later processing, quality control, binning, or other steps.

It is to be appreciated that the controller 109 may be implemented in practice by any combination of hardware, software, and firmware. Also, its functions as described herein may be performed by one unit, or divided up among different components, each of which may be implemented in turn by any combination of hardware, software, and firmware. Program code or instructions for the controller 109 to implement the various methods and functions described herein may be stored in controller readable storage media, such as a memory, within the controller 109, external to the controller 109, or combinations thereof.

While the controller 109 can determine flux of each of the devices 102, the controller 109 also can determine color or other properties of the devices 102.

A power supply 110 provides electricity to the devices 102 in the photometric unit 104. The power supply 110 is connected to an electrical connector 111, which may be one or more rotating electrical contact pins. As the conveyor 101 passes over a rotating electrical pin, one or more parts of the rotating electrical contact pin rotates. This enables power to be provided to the devices 102 on the conveyor 101 as it moves.

In another example of an electrical connector 111, electrical contacts for the devices 102 are incorporated into the conveyor 101. Brushes or another contact mechanism known to those skilled in the art can provide electricity from the power supply 110 to the devices 102 through the electric contacts in the conveyor 101.

In yet another example of an electrical connector 111, probe cards are disposed in or on the conveyor 101. An exemplary probe card is illustrated and described with respect to FIG. 6. Such a probe card fans out the signals to larger pads for external pick-up, which can enable a four-point probe technique for voltage sensing. A connector can provide power to the probe card from the power supply 110.

The space between the heating device 103 and the photometric unit 104 can be minimized to keep devices 102 at a desired temperature. In an example, the heating device 103 and photometric unit 104 can abut.

The system includes pick-and-place robots 112, 113. Each pick-and-place robot 112, 113 is configured to take a device 102 from one location to another and may be connected to an arm, gantry, or overhead frame. The pick-and-place robot 112 is upstream of the photometric unit 104 and the pick-and-place robot 113 is downstream of the photometric unit 104. The pick-and-place robot 112 is configured to place the devices 102 on the conveyor 101. The pick-and-place robot 113 is configured to remove the devices from the conveyor 101. The pick-and-place robots 112, 113 can be configured to move in one, two, or three dimensions and can include an additional rotation movement that can align devices 102 on the conveyor 101. Thus, a device 102 can be rotated 360° besides being moved in one, two, or three dimensions.

The pick-and-place robots 112, 113 may use, for example, suction, pneumatic grippers, or mechanical grippers to grasp or engage the devices 102. Each pick-and-place robot 112, 113 can include one or more grippers. Each gripper can, for example, grasp or engage one device 102.

Each pick-and-place robot 112, 113 in FIG. 1 can grasp or engage one device 102. However, the pick-and-place robots 112, 113 can grasp or engage multiple devices 102 simultaneously. To grasp or engage multiple devices 102, each pick-and-place robot 112, 113 can have multiple grippers.

An input reel (not illustrated) can provide devices 102 for the pick-and-place robot 112 and an output reel (not illustrated) can collect devices 102 from the pick-and-place robot 113. The devices 102 can be provided or removed in other ways. For example, the pick-and-place robots 112, 113 can remove devices 102 from or place devices 102 on a rack or another conveyor.

Figure 2:
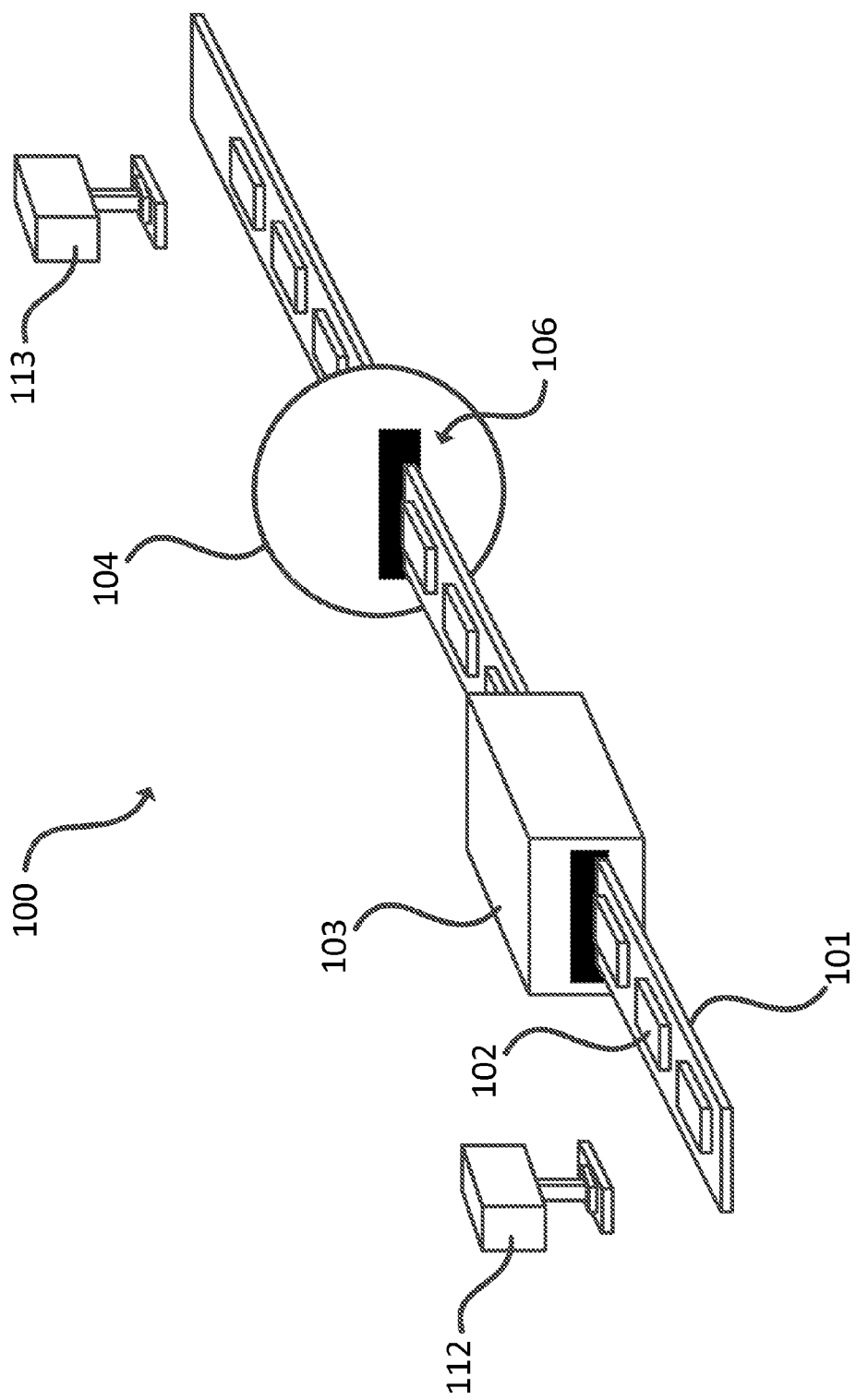
FIG. 2 is a perspective view of a test system of the embodiment of FIG. 1.

FIG. 2 is a perspective view of the test system 100 of FIG. 1. In operation, the pick-and-place robot 112 places devices 102 on the conveyor 101. The conveyor 101 continuously conveys the devices 102 at one or more speeds greater than zero. During operation, the conveyor 101 may not stop while devices 102 are disposed on the conveyor 101. The devices 102 are raised to a desired temperature in the heating device 103 and then transported to the photometric unit 104, which is an integrating sphere in FIG. 2. After passing through the inlet 106 of the photometric unit 104, each device 102 is powered and its flux is measured. The devices 102 exit the photometric unit 104 and are removed from the conveyor 101 by the pick-and-place robot 113.

Figure 3:
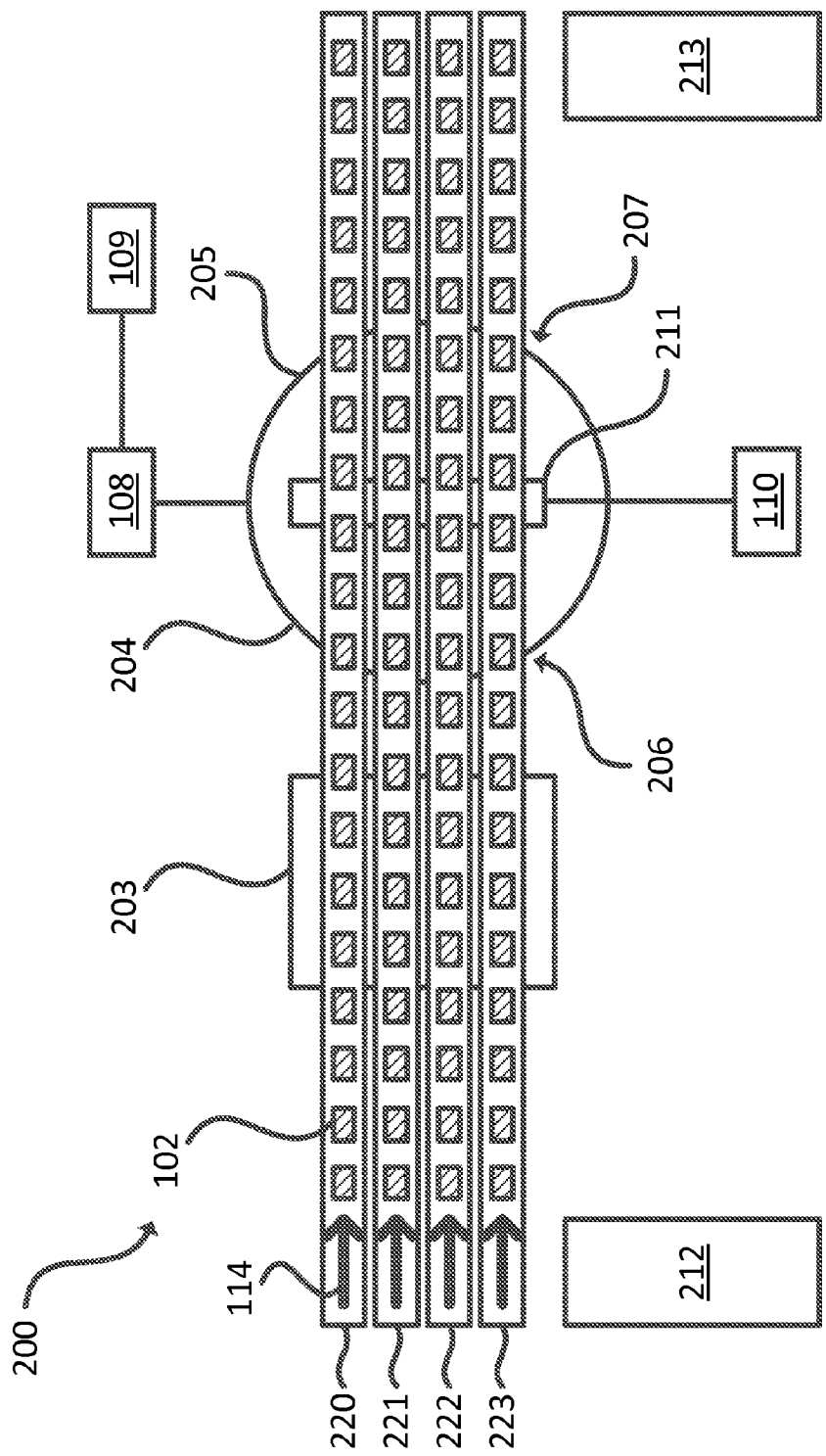
FIG. 3 is a block diagram of a second embodiment of a test system in accordance with the present disclosure.

FIG. 3 is a block diagram of a second embodiment of a test system 200. The test system 200 has multiple conveyors. In the embodiment of FIG. 3, conveyors 220-223 are shown. Each conveyor 220-223 may be similar to the conveyor 101 of FIG. 1. More or fewer conveyors may be used than those illustrated in FIG. 3 and the four conveyors 220-223 of FIG. 3 are merely an example. The conveyors 220-223 all continuously convey devices 102 at one or more speeds greater than zero. Each conveyor 220-223 can convey devices 102 at the same speed or at different speeds at a given time. Thus, the conveyors 220-223 may convey devices 102 at different speeds during different periods. For example, at a given time, the conveyor 220 may be conveying devices 102 faster than the conveyor 222. The conveyors 220-223 may be conveying devices 102 at different speeds to, for example, enable loading or unloading of the devices 102.

The heating device 203 may operate similar to the heating device 103 of FIG. 1, except that the heating device 203 is configured to accommodate multiple conveyors 220-223. Multiple heating devices, each accommodating a single conveyor 220-223 also may be used. Other heating methods besides the heating device 203 or to supplement the heating device 203 are possible.

The photometric unit 204, which may be an integrating sphere, has a body 205 that defines an inlet 206 and outlet 207 with dimensions for the conveyors 220-223 to pass through. The photometric unit 204 may operate similar to the photometric unit 104 of FIG. 1. This photometric unit 204 is connected to a spectrometer 108, which electrically communicates with a controller 109.

In an alternate embodiment, each conveyor 220-223 has a separate inlet and outlet to reduce light loss from the photometric unit 204. Thus, in this example the photometric unit 204 will have four inlets 206 and four outlets 207, each having one of the conveyors 220-223 pass through.

A power supply 110 is connected to one or more rotating electrical contact pins 211. Each conveyor 220-223 may have an independent rotating electrical contact pin 211 or the rotating electrical contact pin 211 may be used for two or more of the conveyors 220-223. Electricity can be provided to the devices 102 in other manners, such as electrical contacts incorporated into the conveyors 220-223 or a probe card.

In the system 200, the devices 102 are tested individually within the photometric unit 204. This may be done sequentially across the conveyors 220-223. In an example, the devices 102 on one conveyor 220 may be staggered with respect to devices 102 on different conveyors 221, 222, or 223. Each device 102 is tested as the device 102 passes the rotating electrical contact pins 211 or other electrical connection. In another example, rows of devices 102 are arranged parallel to one another across the conveyors 220-223 (like those illustrated in FIG. 3). Each device 102 is tested one at a time across the row.

Two pick-and-place robots 212, 213 are configured to place devices 102 on the conveyors 220-223 and remove devices 102 from the conveyors 220-223. Each pick-and-place robot 212, 213 may have the same motion capabilities as pick-and-place robots 112, 113 in FIG. 1, but may include an array of grippers or larger array of grippers than that of FIG. 1 to handle additional devices 102. While only two pick-and-place robots 212, 213 are illustrated, multiple pick-and-place robots may be used to place or remove devices 102 from the conveyors 220-223.

Figure 4:
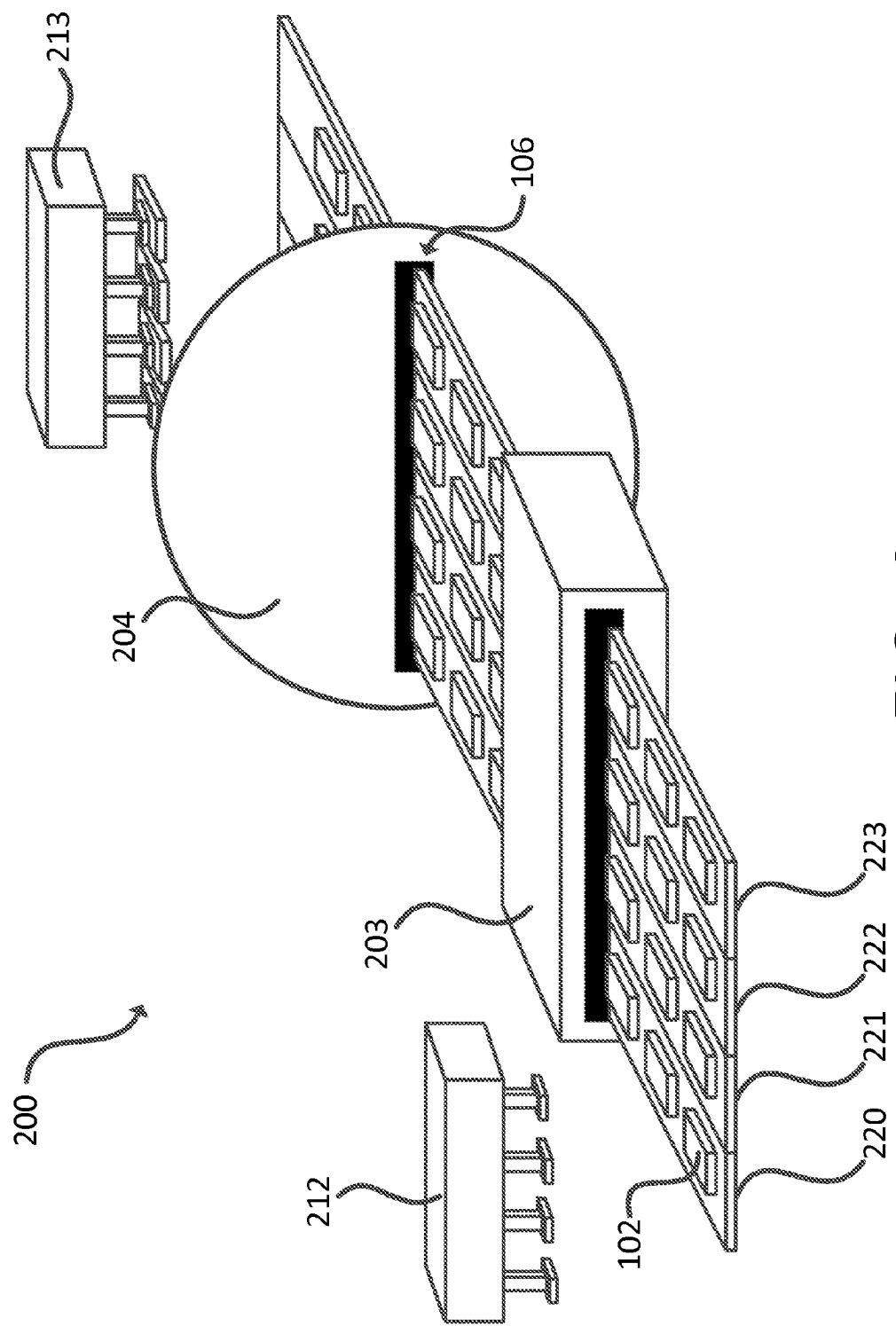
FIG. 4 is a perspective view of a test system of the embodiment of FIG. 3.

FIG. 4 is a perspective view of the test system 200 of FIG. 3. In operation, the pick-and-place robot 212 places devices 102 on the conveyors 220-223. The conveyors 220-223 continuously convey the devices 102 at one or more speeds greater than zero. The devices 102 are raised to a desired temperature in the heating device 203 and then transported to the photometric unit 204, which is an integrating sphere in FIG. 4. After passing through the inlet 106 of the photometric unit 204, each device is powered and its flux is measured. The devices 102 exit the photometric unit 204 and are removed from the conveyors 220-223 by the pick-and-place robot 213.

The embodiments of FIGS. 1-4 provide increased throughput. While pick-and-place robots are illustrated in FIGS. 1-4, other mechanisms can be used to place devices on the conveyor or conveyors.

Figure 5:
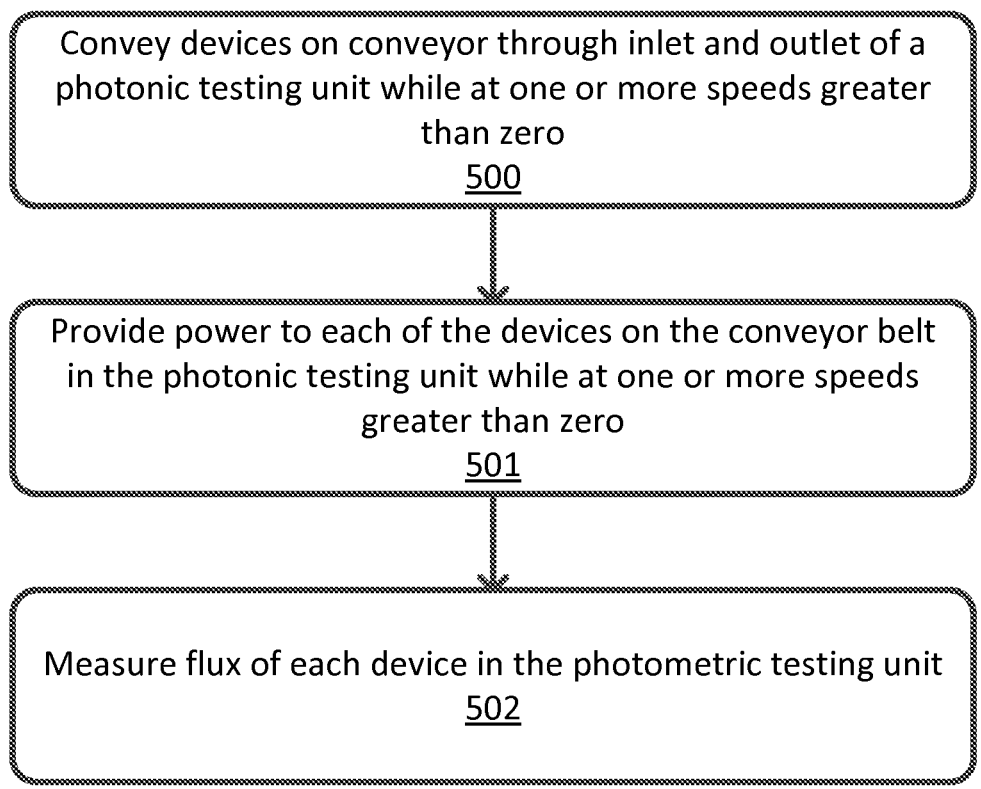
FIG. 5 is a flowchart of a method using a test system in accordance with the present disclosure.

FIG. 5 is a flowchart of a method using a test system. In step 500, devices are conveyed on a conveyor through an inlet and outlet of a photonic testing unit while at one or more speeds greater than zero. The devices can be continuously conveyed at one or more speeds greater than zero. In step 501, power is provided to each of the devices on the conveyor belt in the photonic testing unit while the device is conveyed at one or more speeds greater than zero. This speed or speeds may be the same or different from the speed at which the device is conveyed into the photonic testing unit. The power causes each of the devices to illuminate. Power may be provided to each of the devices in a sequential manner. In step 502, flux is measured for each device in the photometric unit. These measurements may be sequential as power is provided to the individual devices. A device may not be transported through the outlet of the photonic testing unit until power is provided and flux is measured for the particular device.

Figure 6:
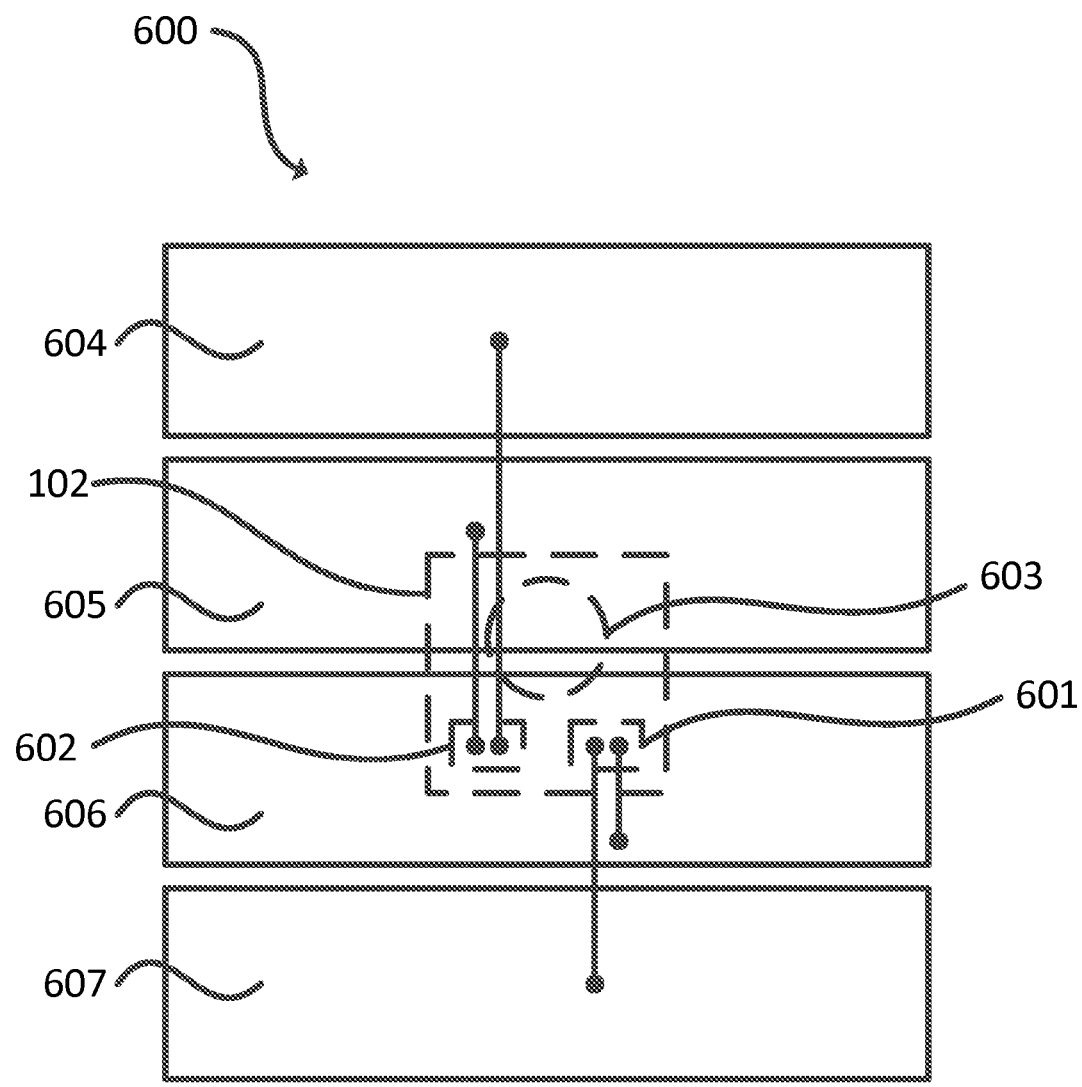
FIG. 6 is a block diagram of a probe card in accordance with the present disclosure.

FIG. 6 is a block diagram of a probe card 600. A device 102 (shown with dotted lines in FIG. 6) is disposed on the probe card 600. The device 102 includes a cathode contact pad 601, anode contact pad 602, and thermal pad 603.

The probe card 600 includes a roller pad for anode current 604, a roller pad for anode voltage 605, a roller pad for cathode current 606, and a roller pad for cathode voltage 607. The roller pads 604-607 can be part of a conveyor or can be a surface of the conveyor that contacts a device.

The roller pads 604-607 on the backside are connected to the contact pads 601-602 on the front side through vias in the probe card 600, which maintain electrical connection with the contact pads 601-602. The roller pad for anode current 604 and roller pad for anode voltage 605 connect to the anode contact pad 602. The roller pad for cathode current 606 and roller pad for cathode voltage 607 connect to the cathode contact pad 601.

The probe card 600 enables four-point probe capability. Use of separate pairs of current-carrying and voltage-sensing roller pads enables resistivity measurements of a device 102 to be taken.

Figure 7:
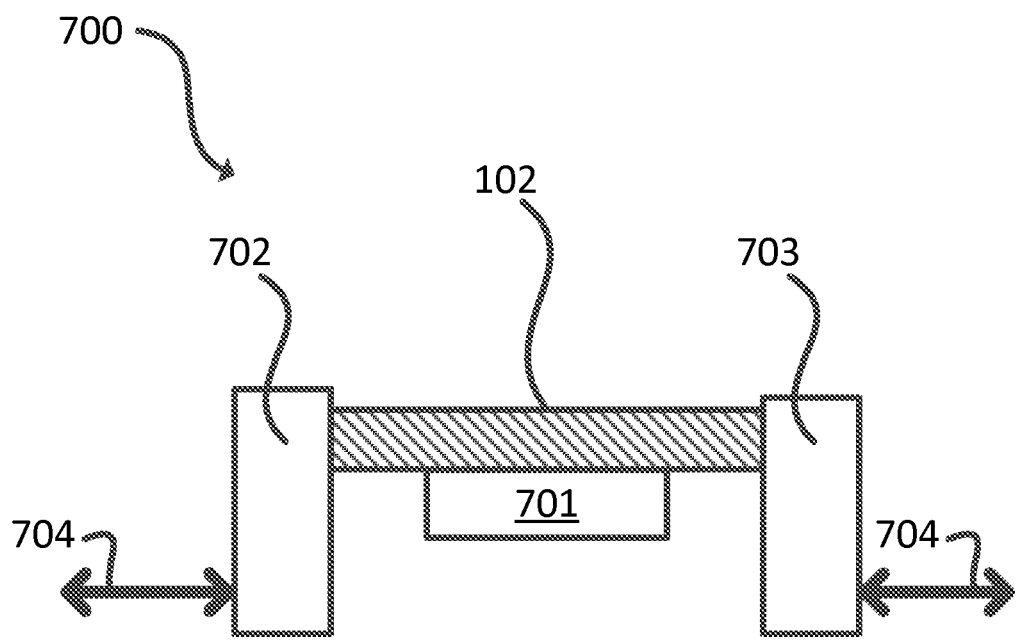
FIG. 7 is a perspective view of an edge grip in accordance with the present disclosure.

FIG. 7 is a perspective view of an edge grip 700. The edge grip 700, which is part of a conveyor, is spring-loaded and configured to hold the device 102 in place during transport and testing. A device 102 is disposed on a base 701. The base 701 may be part of a conveyor, such as the conveyor 101 in FIG. 1 or conveyors 220-223 in FIG. 2. The edge grip 700 includes two grippers 702, 703. Parts of the grippers 702, 703 are urged apart, as seen by the arrows 704, prior to the device 102 being loaded onto the base 701. After loading the device 102 on the base 701, the grippers 702, 703 may be urged closer together, as seen by the arrows 704, and hold the device 102 in place on the base 701. The grippers 702, 703 can be urged apart during removal of the device 102.

While two grippers 702, 703 are illustrated, a single gripper can be used. In one embodiment, a single gripper pushes the device 102 toward a stationary surface of the conveyor. While planar grippers 702, 703 are illustrated, the grippers 702, 703 may have features such as lips or flanges to assist in retention of the device 102.

The edge grip 700 can improve alignment of devices 102. The grippers 702, 703 can urge the device 102 into a desired or optimal position on a conveyor for later testing in the photometric unit.

Other forms of device alignment on a conveyor can be performed. The pick-and-place robots may be capable of sensing and correcting alignment of devices that are picked up. For example, cameras or other sensors may be used to determine the degree of misalignment and a pick-and-place robot can adjust the position of the device when it placed on the conveyor to improve alignment. For example, a pick-and-place robot can rotate a device or adjust linear placement of a device on a conveyor.

In another example, pressurized air can urge a device toward the conveyor. A jet or other blower presses a device against the conveyor. This air can be heated in one embodiment to raise, lower, or maintain the temperature of the devices.

In yet another example, suction can be used instead of or with the pressurized air to pull a device toward the conveyor. Thus, the conveyor can include suction ports through a surface of the conveyor. Air is drawn through the suction ports to clamp a device to the conveyor. One or more vacuum pumps are connected to the conveyor to provide suction.

A photometric unit, such as an integrating sphere, also can be configured to have a single port or aperture while maintaining a desired level of throughput and accuracy. For example, an integrating sphere can be configured to test devices, such as LEDs, one at a time while maintaining a desired level of throughput and accuracy.

Figure 8:
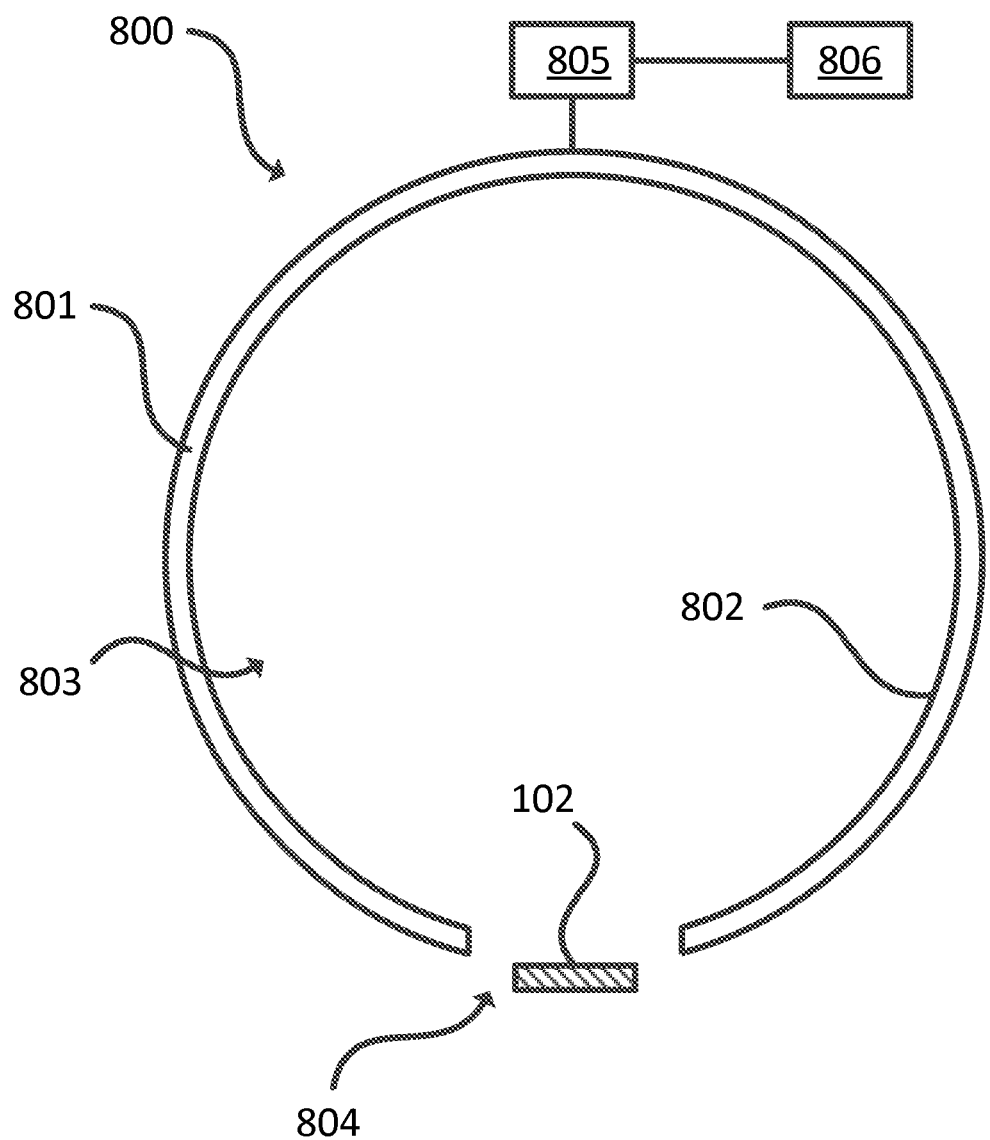
FIG. 8 is a cross-sectional side view of an integrating sphere.

FIG. 8 is a cross-sectional side view of an integrating sphere 800 having a single port 804. The integrating sphere 800 has a body 801 that around a cavity 803, wherein the body 801 defines the port 804. The inner surface 802 that faces the cavity 803 may include a reflective coating. The inner surface 802 may be white. While illustrated in cross-section, the integrating sphere 800 is spherical in three dimensions.

The device 102 is disposed relative to the port 804. A spectrometer 805, which may be similar to the spectrometer 108, is connected to the integrating sphere 800. The spectrometer 805 can measure intensity of light as a function of wavelength or frequency. The spectrometer 805 can be configured to measure a flux of the device 102 or other properties such as color. An optical fiber or light tube can connect the spectrometer 805 and integrating sphere 800, though other optical connections are possible. A controller 806, which may be similar to the controller 109, electrically communicates with the spectrometer 805. The controller 806 is configured to calculate a flux of the device 102 or other properties.

Figure 9:
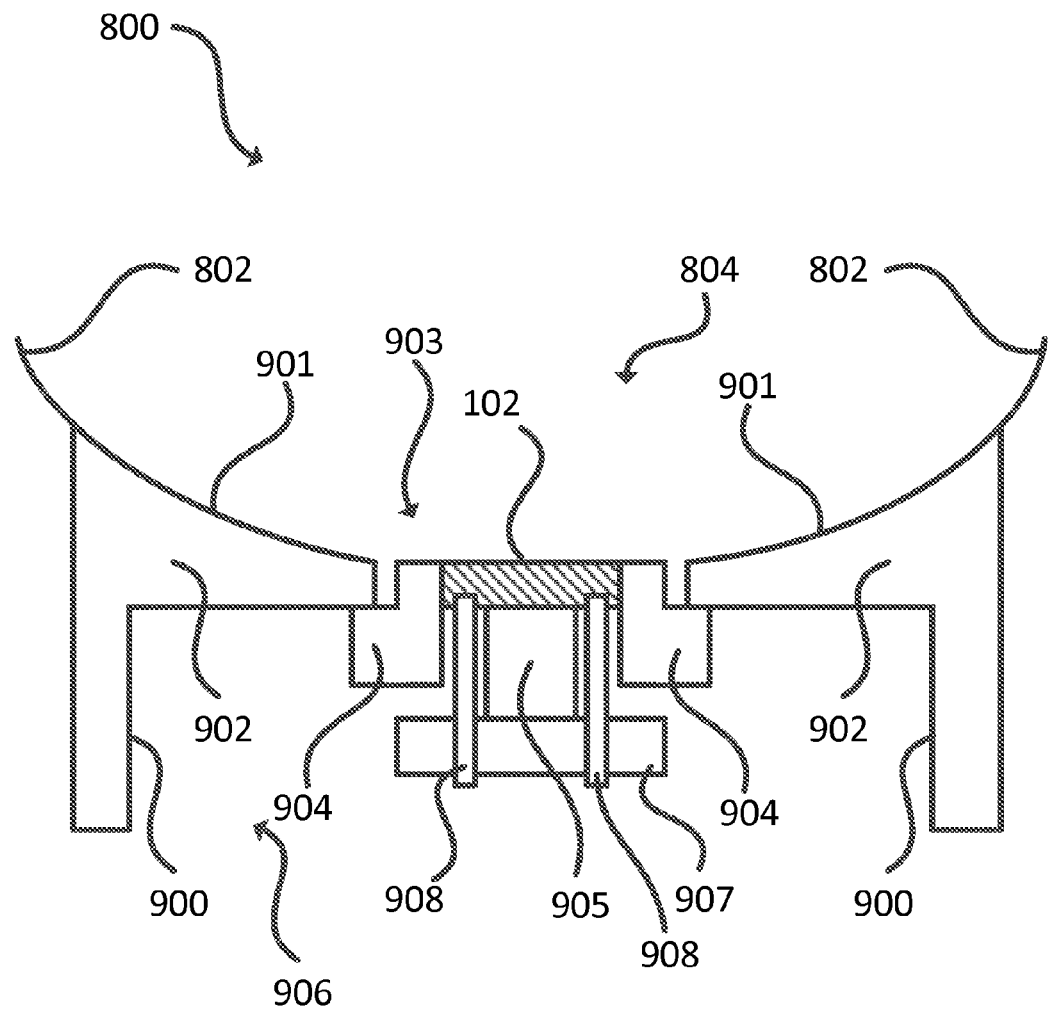
FIG. 9 is a cross-sectional side view of an embodiment of a test mask in accordance with the present disclosure.

FIG. 9 is a cross-sectional side view of an embodiment of a test mask 900. The test mask 900 is positioned in the port 804 of the integrating sphere 800 (which is only partly illustrated in FIG. 9 for ease of understanding). The test mask 900 separates the interior and exterior of the integrating sphere 800 at the port 804. This can enable more complete collection of light from the device 102. The surface 901 of the test mask 900 on the interior of the integrating sphere 800 may have a coating that is the same as that of the inner surface 802 of the integrating sphere 800. The surface 901 also may have a substantially same radius of curvature or optical properties as the inner surface 802. Functionally, the surface 901 may become part of the integrating sphere 800 at the port 804. In an instance, the surface 901 matches the inner surface 802 in curvature. The surface 901 also may be conical, planar, or other shapes, which may have a minimized effect on any measurements.

The shape of the test mask 900 may be configured to accommodate the device 102 and device handling system 905. The cavity 906 in FIG. 9 where the device handling system 905 is positioned also can be eliminated (i.e., the test mask 900 can have a planar bottom surface). This can further reduce translation of the device 102 relative to the integrating sphere 800 to increase throughput.

The mask body 902 of the test mask 900 defines a mask aperture 903. The device 102 can be disposed in the mask aperture 903. The position of the device 102 relative to the mask aperture 903 enables the device 102 to be inserted into the integrating sphere 800 for 100% light collection (e.g., over 0° to 90° from the normal of the top surface of the device 102 or a $2\pi$ solid angle of the forward direction of the device 102). The position of the device 102 relative to the mask aperture 903 can minimize exposure of non-light emitting surfaces, such as surfaces contacting the device 102. These non-light emitting surfaces may include the clamps 904, for example. Any exposed non-light emitting surfaces may be minimized.

The mask aperture 903 may be circular, rectangular, or other shape. The shape may be configured to best match the device 102 and/or the clamps 904.

The test mask 900 can be configured to fit into the port 804. The test mask 900 may be configured to accommodate devices 102 that are for testing or for calibration. The device 102 can be, for example, an LED, standard LED, a test lamp, or a standard lamp. Accommodating all these devices minimizes variation in absorption during calibration. Calibration errors can be minimized and dependence on an auxiliary lamp to correct these errors can be eliminated. Use of a standard LED can make it easier to perform more frequent and accurate calibrations.

The clamps 904 are configured to secure the device 102 in position. The clamps 904 are configured to translate toward and away from the device 102. The clamps 904 may be mounted on turret arms. While two clamps 904 are illustrated, more or fewer than two clamps 904 are possible. One or more surfaces of the clamps 904 may be optically similar to or the same as the inner surface 802. This may include the shape, curvature, or coating. However, surfaces of the clamps 904 may differ optically from the inner surface 802 and any reduced testing performance can be minimized. The measurements may tolerate a certain degree of deviation from the optical properties of the inner surface 802.

The device 102 is disposed on a device handling system 905. The device handling system 905 can include a probe card 907. This probe card 907 may include, for example, two probes 908 for delivering current to the device 102 and two probes 908 for measuring voltage across the device 102. Only two probes 908 are illustrated in the cross-section of FIG. 9. The probe card 907 may be a four-point Kelvin probe.

The test mask 900 minimizes light loss out of the port 804 and unwanted light from entering the port 804. The device 102 is positioned in the integrating sphere 800 or flush with the inner surface 802. Errors due to light loss or additional light can be reduced.

There is a gap between the test mask 900 and the device 102 or the clamps 904. This prevents temperature changes to the device 102 due to thermal conduction with the test mask 900. Devices 102 can be sensitive to temperature. This gap provides more control and stabilization of the temperature of the device 102 to which optical and electrical testing results are sensitive. Thus, errors due to temperature can be reduced.

The non-ideal area of the integrating sphere 800, which has a different shape and/or optical properties from the inner surface 802 of the integrating sphere 800, is minimized due to use of the test mask 900 having similar curvatures and/or optical properties as that of the inner surface 802 of the integrating sphere 800.

Figure 10:
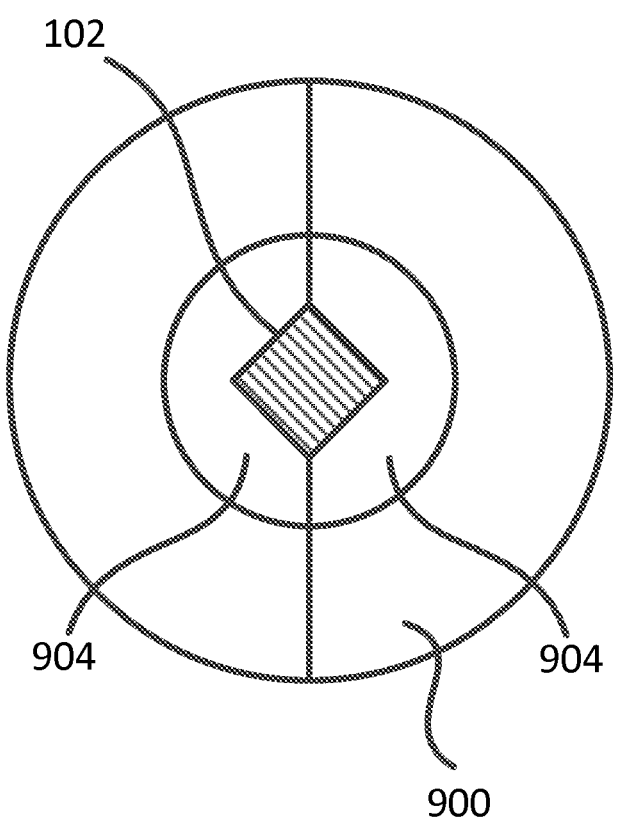
FIG. 10 is a top view of the test mask of the embodiment of FIG. 9.

FIG. 10 is a top view of the test mask 900 of the embodiment of FIG. 9. In an embodiment, the test mask 900 has a doughnut shape. The device 102 and clamps 904 are configured to be positioned in the center of the test mask 900. While the clamps 904 are illustrated as completely surrounding the device 102, less than an entirety of the outer perimeter of the device 102 may be contacted by the clamps 904.

The test mask 900 can be compatible with various integrating sphere 800 designs or clamp 904 designs. The test mask 900 can be designed to fit existing equipment, such as integrating spheres or probe cards. The test mask 900 can be retrofitted onto an integrating sphere, such as the integrating sphere 800.

The test mask 900 can be fixed or movable. The test mask 900 can be connected to the integrating sphere 800 or another structure. The test mask 900 can serve as a stopper or aligner for the device 102. To serve as an aligner, the test mask 900 may include a pin or key.

Use of the test mask 900 can enable testing throughputs of around 15,000 devices 102 per hour. Vertical translation of the device 102 into the port 804 or integrating sphere 800 can be minimized to improve throughput. Light collection can be balanced against vertical travel to improve throughput.

Use of the test mask 900 can simplify the design of other components. For example, the device handling system 905 may not need to accommodate for light loss because the test mask 900 and/or clamps 904 provide this feature. The function of a controller connected with the integrating sphere 800 likewise may not need to accommodate for light loss or entry of unwanted light.

The test mask 900 provides a low-cost, highly-effective approach for obtaining complete collection of light while maintaining the integrity of the integrating sphere 800 and substantially retaining the throughput of optical testing for device production. The test mask 900 also makes calibration standards more compatible with such optical testing equipment and, thus, more likely to be adopted in device production and integrated into the testing equipment. Complete light collection and adoption of integrated calibration standards result in a significant reduction of measurement errors and uncertainties, allowing device manufacturers to make measurement tolerances and bin sizes (for lumens and color) smaller in sorting process, and benefit from the subsequent higher yield and/or higher grades of products.

Figure 11:
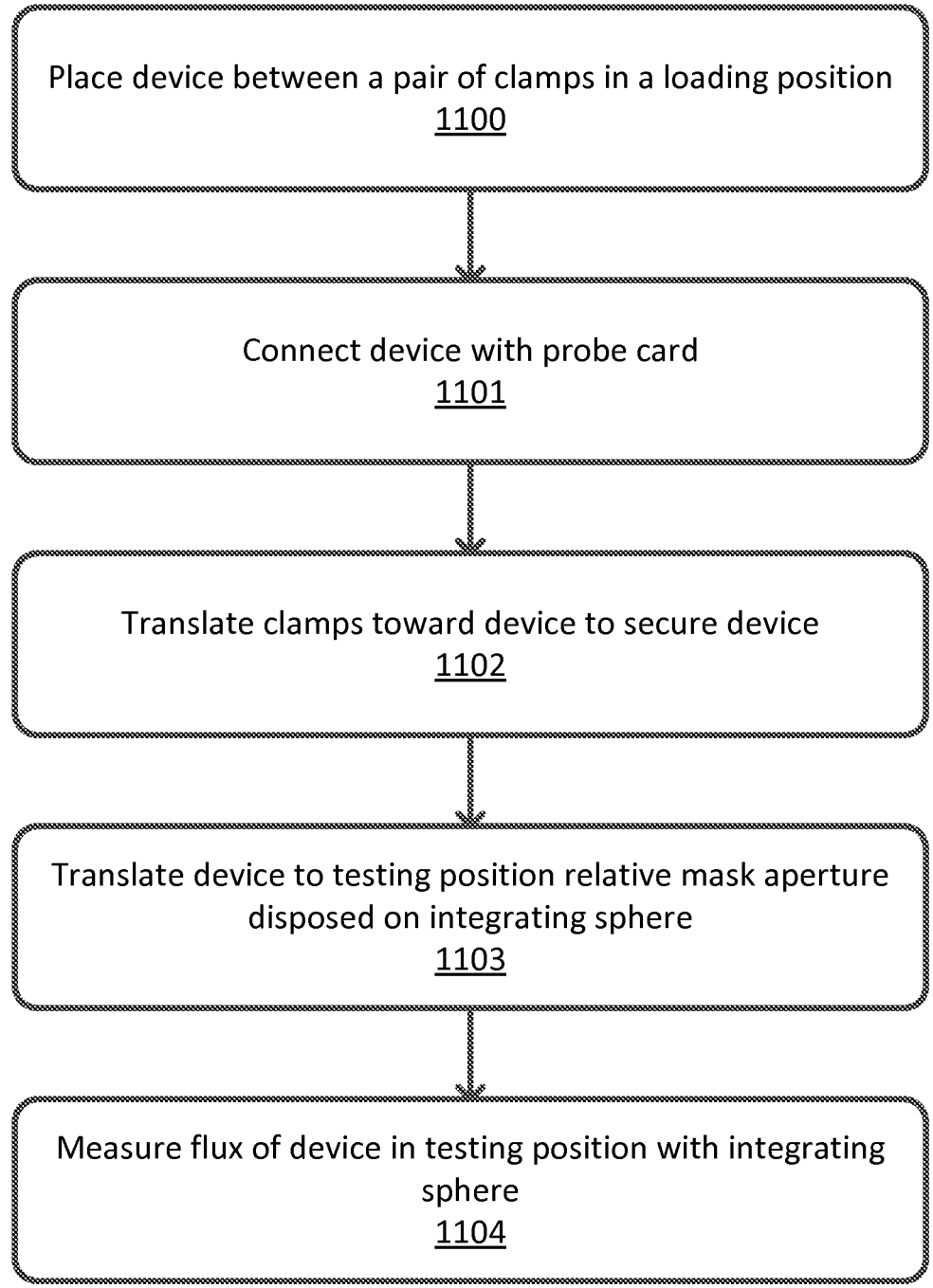
FIG. 11 is a flowchart of a method using a test mask in accordance with the present disclosure.

FIG. 11 is a flowchart of a method using a test mask. In 1100, a device is placed between a pair of clamps of a device handling system in a loading position. In 1101, the device is connected with a probe card. The probe card can include two probes for delivering current to the device and two probes for measuring voltage across the device. In 1102, each clamp is translated toward the device to secure the device between the clamps. In 1103, the device is translated to a testing position relative to a mask aperture of a test mask disposed on an integrating sphere (such as that illustrated in FIG. 9). The device becomes disposed in the mask aperture of a test mask. A surface of the test mask is at least partially curved to have a same or similar radius of curvature as the integrating sphere. The surface of the test mask continues a curvature of the integrating sphere when disposed in a port of the integrating sphere. In 1104, a flux of the device is measured with the integrating sphere when the device is in the testing position.

Figure 12:
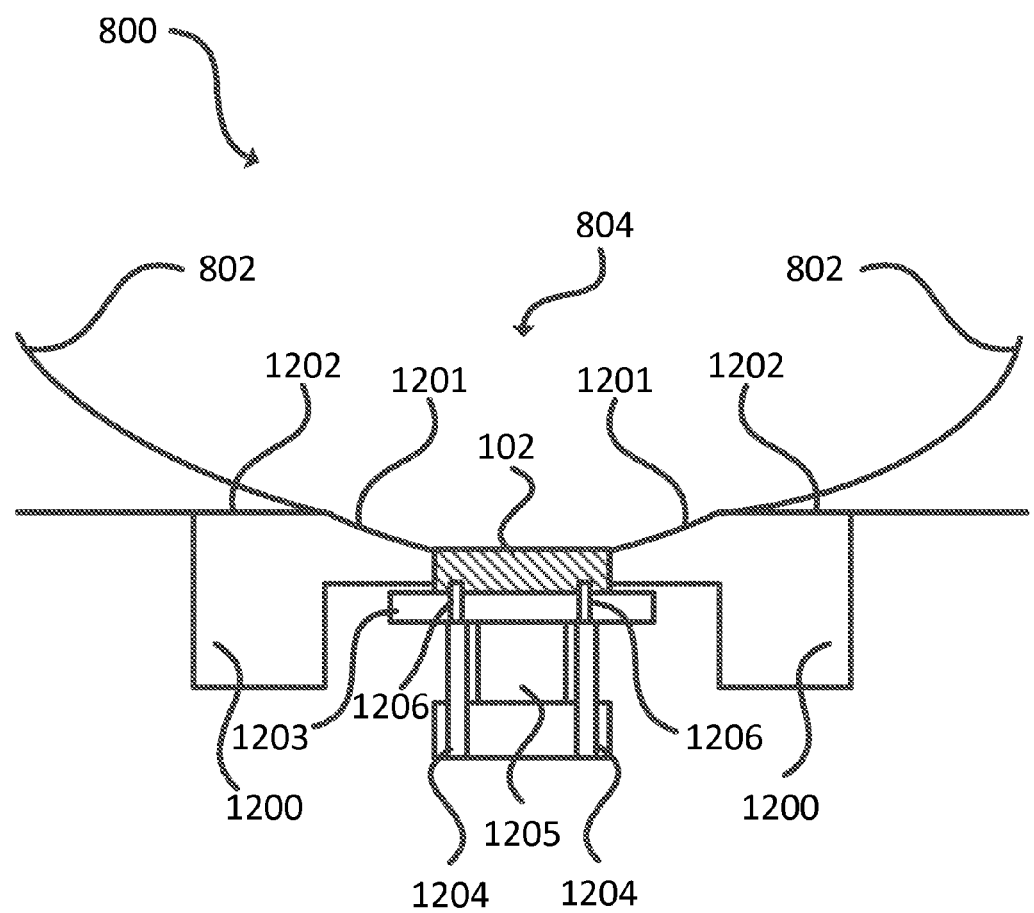
FIG. 12 is a cross-sectional side view of an embodiment of clamps in accordance with the present disclosure.

FIG. 12 is a cross-sectional side view of an embodiment of clamps 1200. The clamps 1200 operate with the integrating sphere 800. The clamps 1200 are positioned in the port 804 of the integrating sphere 800 (which is only partly illustrated in FIG. 12 for ease of understanding). The surfaces 1201 of the clamps 1200 have a similar shape (including radius of curvature) and optical properties as the inner surface 802. For example, the shape and optical properties may be substantially the same or substantially the same between the surface 1201 and inner surface 802. In FIG. 12, the surfaces 1201 are not perfectly matched to that of the inner surface 802, though such a shape for the surfaces 1201 is possible. The surfaces 1201 can be positioned so that these become an extension of the inner surface 802 when the device 102 is being measured. This can enable 100% collection of the light from the device 102 with the integrating sphere 800 in a $2\pi$ solid angle in the forward direction of the device 102.

The surfaces 1201 also can be less similar in shape as the inner surface 802. For example, the surfaces 1201 can be conical.

Any surfaces of the clamps 1200 that contacts the device 102 may be planar, but also may be spherical or other shapes.

A probe card 1203, which may be round, rectangular, or other shapes, is connected with the device 102. The probe card can have two probes 1206 for delivering current to the device and two probes 1206 for measuring voltage across the device 102. Only two probes 1206 are illustrated in the cross-section of FIG. 12. These probes 1206 contact the lead pads on the backside of the device 102. Each probe 1206 can be, for example, a pogo pin. These probes 1206 can be connected through a via and a surface conductor on the probe card 1203 to a probe pad between the probe 1206 and external probe 1204. Each probe pad for the probes 1206 is contacted by an external probe 1204. The external probes 1204 can have the same electrical function as its corresponding probe 1206. The probes 1206 may be relatively short and thin compared to the external probes 1204 and the probes 1206 may use enough contact force to establish a reliable electrical connection. The size of the external probes 1204 is not limited by the size of the device 102 and can be larger than the probes 1206, which permits looser dimensional and positioning tolerances, larger impact force upon contact, larger contact force during testing, and faster contact with higher throughput. Larger external probes 1204 can be more durable, reliable, and cheaper than probes that directly connect with a device 102. Larger external probes 1204 also can operate faster than probes that directly connect with a device 102, which increases throughput. The probe card 1203 can be connected to a probe card base 1205, which also can withstand relatively large impact and contact forces. The probe card 1203 may be secured to the probe card base 1205 using, for example, screws. The probe card 1203 can take all direct impacts from the external probes 1204.

The probes 1206 may be smaller than the external probes 1204, but the probes 1206 can have a similar lifespan as the external probes 1204 due to the design of FIG. 12. Lifetime of the probes 1206 can be increased by connecting the device 102 to the probes 1206 more slowly or with less force.

Another surface 1202 of each of the clamps 1200 can be planar to fit against a matching port surface of the integrating sphere 800. This can enable a closer fit between the clamps 1200 and the integrating sphere 800. The surface 1202 may have other shapes. For example, the shape of the surface 1202 may be curved or angled to reduce light loss or unwanted light entry. The shape of the port surface of the integrating sphere 800 may correspond to the shape of the surface 1202.

The clamps 1200 can match the shape of the port 804 laterally so minimize deviation from a uniform and spherical inner surface 802 of the integrating sphere 800. This also can minimize vertical travel of the device 102 measured using the integrating sphere 800. For example, zero vertical travel of the device 102 into the port 804 or integrating sphere 800 may be needed to position the device for testing. In one example, the device 102 performs no vertical travel (i.e., only horizontal translation parallel to the aperture of the port 804 formed by the inner surface 802 may be used), which increases throughput. This may save, for example, 120 ms per device 102, which can double throughput to, for example, approximately 30,000 devices per hour without substantially impacting accuracy. This also simplifies the design and increases reliability.

The clamps 1200 can enable complete collection of light from the device 102 without altering optical properties of the integrating sphere 800. This can ensure accurate measurement.

The device 102 is not subject to direct impacted by the external probes 1204 or other objects once clamped. This increases reliability. Secure mechanical handling and reliable electrical connection can be provided, particularly for smaller devices 102, such as those in the CSP format. Problems where contact with probes dislodges the device from the clamps can be avoided or minimized.

Figure 13:
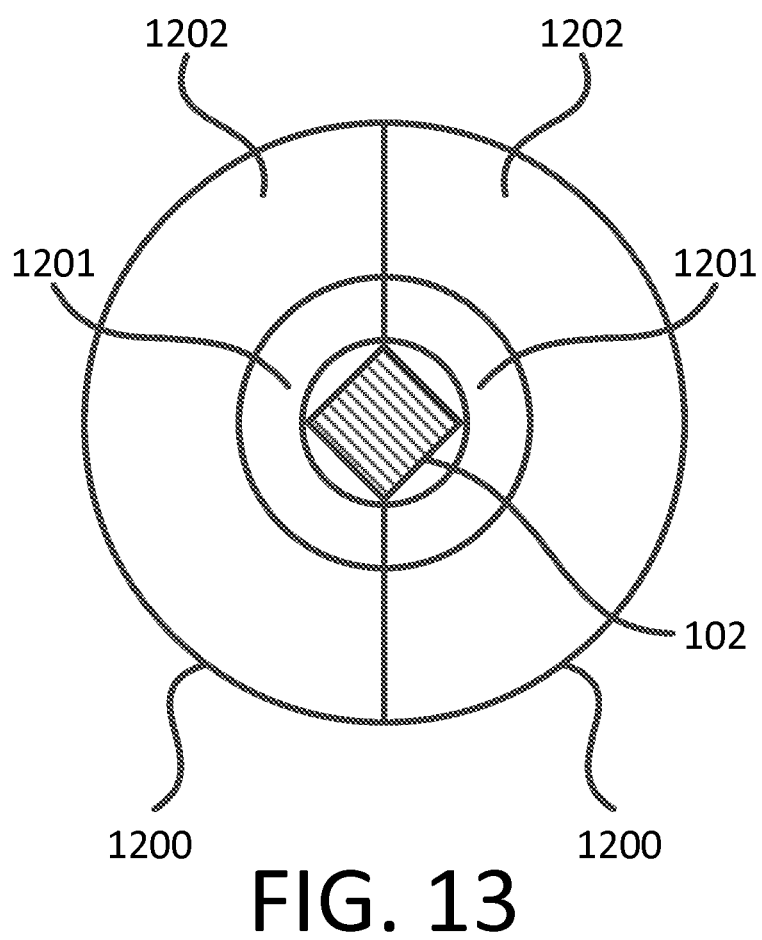
FIG. 13 is a top view of the clamps of the embodiment of FIG. 12.

FIG. 13 is a top view of the clamps 1200 of the embodiment of FIG. 12. The device 102 is positioned between the clamps 1200. At least the surfaces 1201 are exposed in the integrating sphere during testing the device 102.

The clamps 1200 also can accommodate standard LEDs or standard lamps for calibration. The design of the clamps 1200 or position relative to the integrating sphere 800 may be adjusted as needed.

The clamps 1200 substantially enhance reliability and accuracy of optical and electrical testing while maintaining or improving throughput, particularly for small devices (e.g., CSP devices). This enables manufacturers to have smaller measurement tolerances and bin sizes (for lumens and color) in a sorting process and provides benefits to the subsequent higher yield and/or higher grades of products, without lowering productivity.

Figure 14:
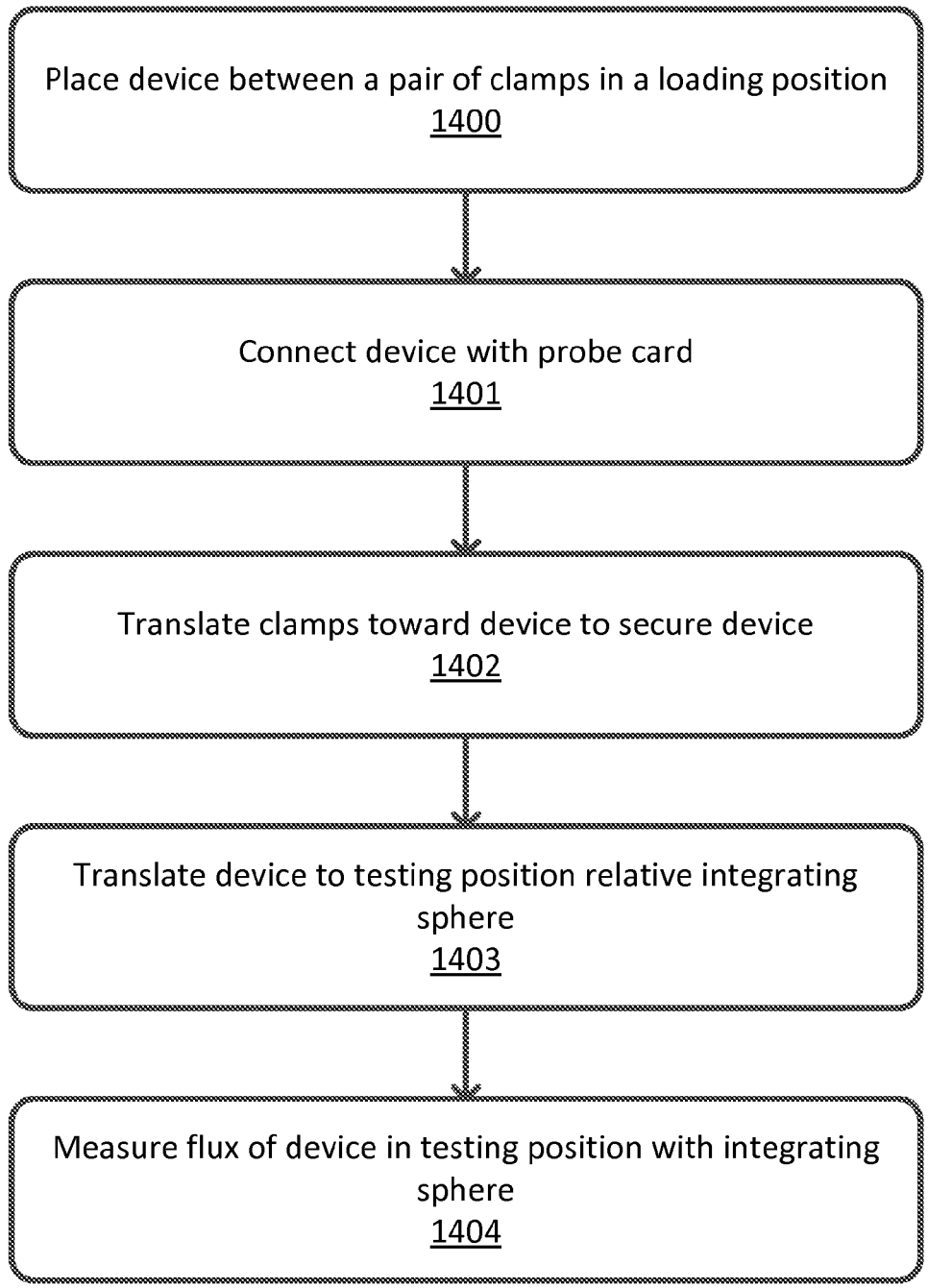
FIG. 14 is a flowchart of a method using clamps in accordance with the present disclosure.

FIG. 14 is a flowchart of a method using clamps. In 1400, a device is placed between a pair of clamps in a loading position. A surface of each of the clamps is partially curved to have a same radius of curvature as the integrating sphere. In 1401, the device is connected with a probe card. The probe card can have two probes for delivering current to the device and two probes for measuring voltage across the device. In 1402, the clamps are translated toward the device thereby securing it between the clamps. In 1403, the device is translated to a testing position (such as that illustrated in FIG. 12) relative to an integrating sphere. This translation may be only horizontal. In 1404, a flux of the device is measured in a testing position with the integrating sphere.

Figure 15:
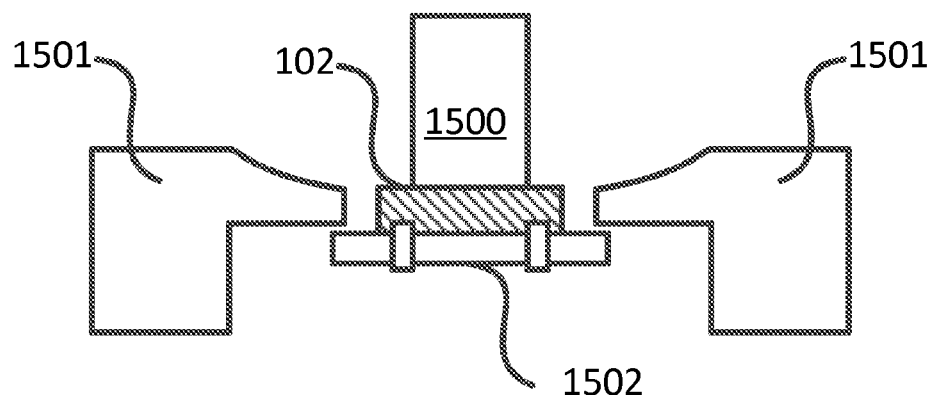
FIG. 15 is a cross-sectional side view of a device being positioned relative to clamps during a first time period.

FIG. 15 is a cross-sectional side view of a device being positioned relative to clamps during a first time period. The clamps 1501 are translated to an open or loading position. The device 102 is laterally moved above its loading position by a vacuum pick-up 1500 and then pushed down by the vacuum pick-up 1500 to its designated height. This connects the device 102 with the probe card 1502 and can ensure alignment during connection with the probe card 1502. The vacuum pick-up 1500 secures the device 102 during connection with the probe card 1502. Any impact between the device 102 and the probe card 1502 may be performed at a speed configured to minimize impact and prolong life of the probe card 1502. Furthermore, a probe card 1502 with internal probes can exert less force on the device 102, which can ensure that the device 102 is held securely during connection.

In another instance, the vacuum pick-up 1500 pushes the device 102 down to its designated height. This distance the device 102 is pushed down may be, for example, several tenths of a millimeter above the probe card 1502. Then the vacuum pick-up 1500 releases the device 102, which falls onto the probe card 1502 by gravity.

In another instance, the clamps 1501 may translate the device 102 downward onto the probe card 1502 for connection after the clamps 1501 close to secure the device 102. The internal probes of the probe card 1502 may have zero impact on the device 102 because the device 102 is already disposed on the internal probes when any downward translation begins. The vacuum pick-up 1500 may have zero drag against the device 102 while the clamps 1501 are closing.

In another instance, the probe card 1502 may translate upward to connect with the device 102 after the clamps 1501 close to secure the device 102. The internal probes of the probe card 1502 may have zero impact on the device 102 because the device 102 is already disposed on the internal probes when any upward translation begins. The vacuum pick-up 1500 may have zero drag against the device 102 while the clamps 1501 are closing.

Figure 16:
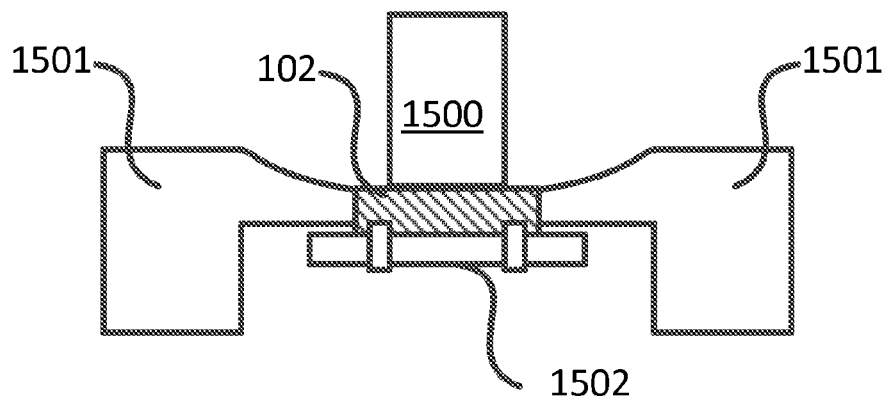
FIG. 16 is a cross-sectional side view of a device being positioned relative to clamps during a second time period.

FIG. 16 is a cross-sectional side view of a device being positioned relative to clamps during a second time period. Vacuum to the vacuum pick-up 1500 is turned off, which releases the device 102. The clamps 1501 may then close to secure the device 102 (if the clamps 1501 have not already done so). The vacuum pick-up 1500 then translates out of the way so that the vacuum pick-up 1500 does not impede testing of the device 102.

While FIGS. 15 and 16 are illustrated corresponding to the embodiment of FIG. 12, the embodiments of FIGS. 15 and 16 also can be used with the embodiment of FIG. 9 or other embodiments disclosed herein.

Figure 17:
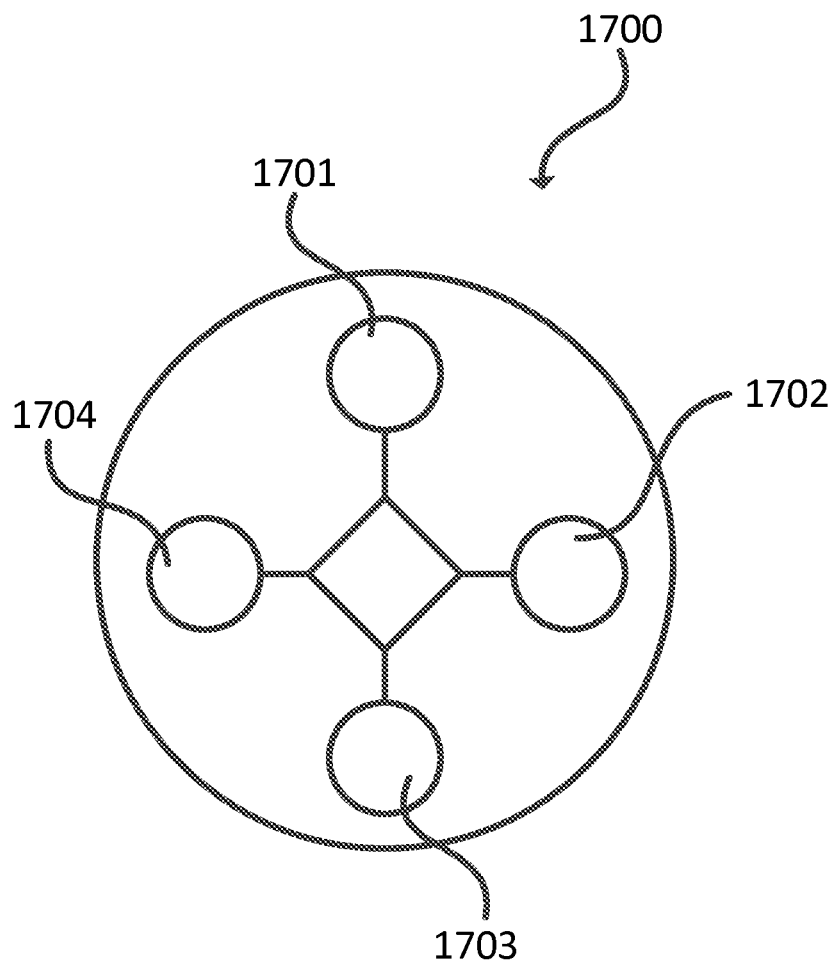
FIG. 17 is a bottom view of a probe card.

FIG. 17 is a bottom view of a probe card. The probe card 1700, which may correspond to the probe card of FIG. 9 or 12, has external contact pads. The contact pad 1701 is V−. The contact pad 1702 is I−. The contact pad 1703 is V+. The contact pad 1704 is I+. However, other configurations are possible.

Use of the probe card 1700 can enable both electrical and optical testing of a device 102.

The embodiments of FIGS. 9 and 12 enable testing outside of a dark room or dark box.

Embodiments of the test systems disclosed herein can be used to bin or otherwise sort the devices. Devices will vary in, for example, color, flux, or forward voltage These differences can be significant, so devices are evaluated and delivered to customers in bins. For example, devices can be binned by light output or color temperature. The results from the photometric unit can be used to sort the individual devices into desired bins. A controller can store measurement results for individual devices that can be used for later sorting. A pick-and-place robot or other system also may be used to place the devices transported from the photometric unit into different locations for binning. For example, devices can be binned onto different reels, conveyors, racks, containers, or other devices.

While some embodiments disclosed herein measure flux, the photometric units or testing systems disclosed herein also can measure color or other properties.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A test system comprising:
   a photometric testing unit having a body around a cavity, wherein the body defines an inlet and an outlet;
   a conveyor that projects through the photometric testing unit, wherein the conveyor is disposed in the inlet and the outlet, and wherein the conveyor is configured to move continuously at one or more speeds greater than zero;
   a spectrometer connected to the photometric testing unit, wherein the spectrometer is configured to measure a flux of one of a plurality of devices on the conveyor in the cavity of the photometric testing unit; and
   an electrical connection configured to power one of the devices disposed on the conveyor belt in the cavity of the photometric testing unit while the conveyor is in motion, wherein the electrical connection comprises a probe card configured to make a four-point contact with one of the devices on the conveyor, the probe card including an anode current roller pad, an anode voltage roller pad, a cathode current roller pad, and a cathode voltage roller pad, wherein the anode current roller pad and the anode voltage roller pad connect to an anode contact on one of the devices on the conveyor, and wherein the cathode current roller pad and the cathode voltage roller pad connect to a cathode contact on one of the devices on the conveyor.

2. The test system of claim 1, wherein the photometric testing unit comprises an integrating sphere.

3. The test system of claim 1, further comprising a second conveyor that projects through the inlet and the outlet of the photometric testing unit.

4. The test system of claim 1, further comprising a controller connected to the spectrometer, wherein the controller is configured to calculate the flux, and wherein the controller is configured to calibrate for light loss through the outlet, through the inlet, and due to presence of the conveyor.

5. The test system of claim 1, wherein the devices comprise LEDs and wherein the conveyor further comprises a spring-loaded edge grip configured to hold the LEDs on the conveyor.

6. The test system of claim 1, further comprising a first pick and place robot upstream of the photometric testing unit and a second pick and place robot downstream of the photometric testing unit, wherein the first pick and place robot is configured to place the devices on the conveyor and the second pick and place robot is configured to remove the devices from the conveyor.

7. The test system of claim 1, wherein the conveyor is configured to move at a constant speed.

8. The test system of claim 1, further comprising a heating device configured to heat the devices on the conveyor.

* * * * *